US012598957B2

(12) United States Patent
Matsumoto

(10) Patent No.: US 12,598,957 B2
(45) Date of Patent: Apr. 7, 2026

(54) SUBSTRATE TRANSFER APPARATUS AND SUBSTRATE TRANSFER METHOD

(71) Applicant: Tokyo Electron Limited, Tokyo (JP)

(72) Inventor: Wataru Matsumoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 853 days.

(21) Appl. No.: 17/962,411

(22) Filed: Oct. 7, 2022

(65) Prior Publication Data

US 2023/0117258 A1     Apr. 20, 2023

(30) Foreign Application Priority Data

Oct. 19, 2021     (JP) ................................. 2021-171208

(51) Int. Cl.
*H01L 21/683*          (2006.01)
*H01L 21/677*          (2006.01)

(52) U.S. Cl.
CPC .... *H01L 21/6838* (2013.01); *H01L 21/67709* (2013.01)

(58) Field of Classification Search
None
See application file for complete search history.

(56) References Cited

U.S. PATENT DOCUMENTS

| 10,971,385 | B2 | 4/2021 | Oka et al. |
| 11,764,092 | B2 | 9/2023 | Hatano et al. |

| 11,862,502 | B2 * | 1/2024 | Wei ....................... B25J 15/0608 |
| 2010/0008688 | A1 | 1/2010 | Kimura |
| 2015/0235815 | A1 * | 8/2015 | Gomi ................ H01J 37/32733 |
| | | | 204/298.27 |
| 2019/0131161 | A1 * | 5/2019 | Raghavan ........... H01L 21/6838 |
| 2020/0126828 | A1 | 4/2020 | Oka et al. |
| 2021/0242765 | A1 * | 8/2021 | Suzuki ................... H02K 11/21 |
| 2021/0265188 | A1 * | 8/2021 | Moura .............. H01L 21/67161 |
| 2021/0296150 | A1 * | 9/2021 | Berger ............. H01L 21/67173 |
| 2021/0358788 | A1 * | 11/2021 | Berger ............. H01L 21/67173 |
| 2022/0037181 | A1 * | 2/2022 | Hatano ............. H01L 21/67196 |
| 2022/0319889 | A1 * | 10/2022 | Shindo ............. H01L 21/67712 |

(Continued)

FOREIGN PATENT DOCUMENTS

| JP | 2004-174669 A | 6/2004 |
| JP | 2014-072263 A | 4/2014 |
| JP | 2018-504784 A | 2/2018 |

(Continued)

*Primary Examiner* — Steven M Marsh
(74) *Attorney, Agent, or Firm* — Fenwick & West LLP

(57) ABSTRACT

A substrate transfer method for transferring a substrate using a first transfer body and at least one second transfer body comprises transferring the substrate using the first transfer body to a predetermined first substrate reference position in a module, receiving the substrate at the first substrate reference position using the second transfer body, and transferring the substrate to a detection device by moving the second transfer body to a predetermined first transfer body reference position and detecting positional misalignment in plan view between a position of the substrate and a predetermined second substrate reference position in the detection device. Each of the first transfer body and the second transfer body floats from a bottom portion of a substrate transfer area by a magnetic force and moves in a horizontal direction while supporting the substrate.

12 Claims, 12 Drawing Sheets

(56)         References Cited

U.S. PATENT DOCUMENTS

| | | | |
|---|---|---|---|
| 2022/0415688 | A1 | 12/2022 | Hatano et al. |
| 2023/0377927 | A1 | 11/2023 | Hatano et al. |

FOREIGN PATENT DOCUMENTS

| | | | | |
|---|---|---|---|---|
| JP | 2018-146983 | A | 9/2018 | |
| JP | 2021-086986 | A | 6/2021 | |
| JP | 2021-086987 | A | 6/2021 | |
| KR | 10-2009-0082345 | A | 7/2009 | |
| KR | 10-2020-0043911 | A | 4/2020 | |
| WO | WO 2016/118335 | A1 | 7/2016 | |
| WO | WO-2021043411 | A1 * | 3/2021 | ............. C23C 16/54 |

* cited by examiner

SUBSTRATE TRANSFER APPARATUS AND SUBSTRATE TRANSFER METHOD

CROSS-REFERENCE TO RELATED APPLICATIONS

This application claims priority to Japanese Patent Application No. 2021-171208 filed on Oct. 19, 2021, the entire contents of which are incorporated herein by reference.

TECHNICAL FIELD

The present disclosure relates to a substrate transfer apparatus and a substrate transfer method.

BACKGROUND

In a semiconductor device manufacturing process, a semiconductor wafer (hereinafter referred to as "wafer") that is a substrate is transferred and processed in an apparatus. Japanese Laid-open Patent Publication No. 2021-86987 discloses that the wafer is transferred using a transfer mechanism that floats from a bottom portion of the apparatus by magnetism. In addition, Japanese Laid-open Patent Publication No. 2018-146983 discloses that a remote controller (teaching pendant) controls a storage state in a wafer stage of an exposure apparatus that is moved on a floor by a wheel.

SUMMARY

The present disclosure provides a technique for easily obtaining and utilizing a positional relationship in plan view between a module and a transfer body for transferring a substrate.

One aspect of the present disclosure provides a substrate transfer method for transferring a substrate using a first transfer body and at least one second transfer body, each floating from a bottom portion of a substrate transfer area by a magnetic force and moving in a horizontal direction while supporting the substrate, comprising transferring the substrate using the first transfer body to a predetermined first substrate reference position in a module, receiving the substrate at the first substrate reference position using the second transfer body, and transferring the substrate to a detection device by moving the second transfer body to a predetermined first transfer body reference position and detecting positional misalignment in plan view between a position of the substrate and a predetermined second substrate reference position in the detection device.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
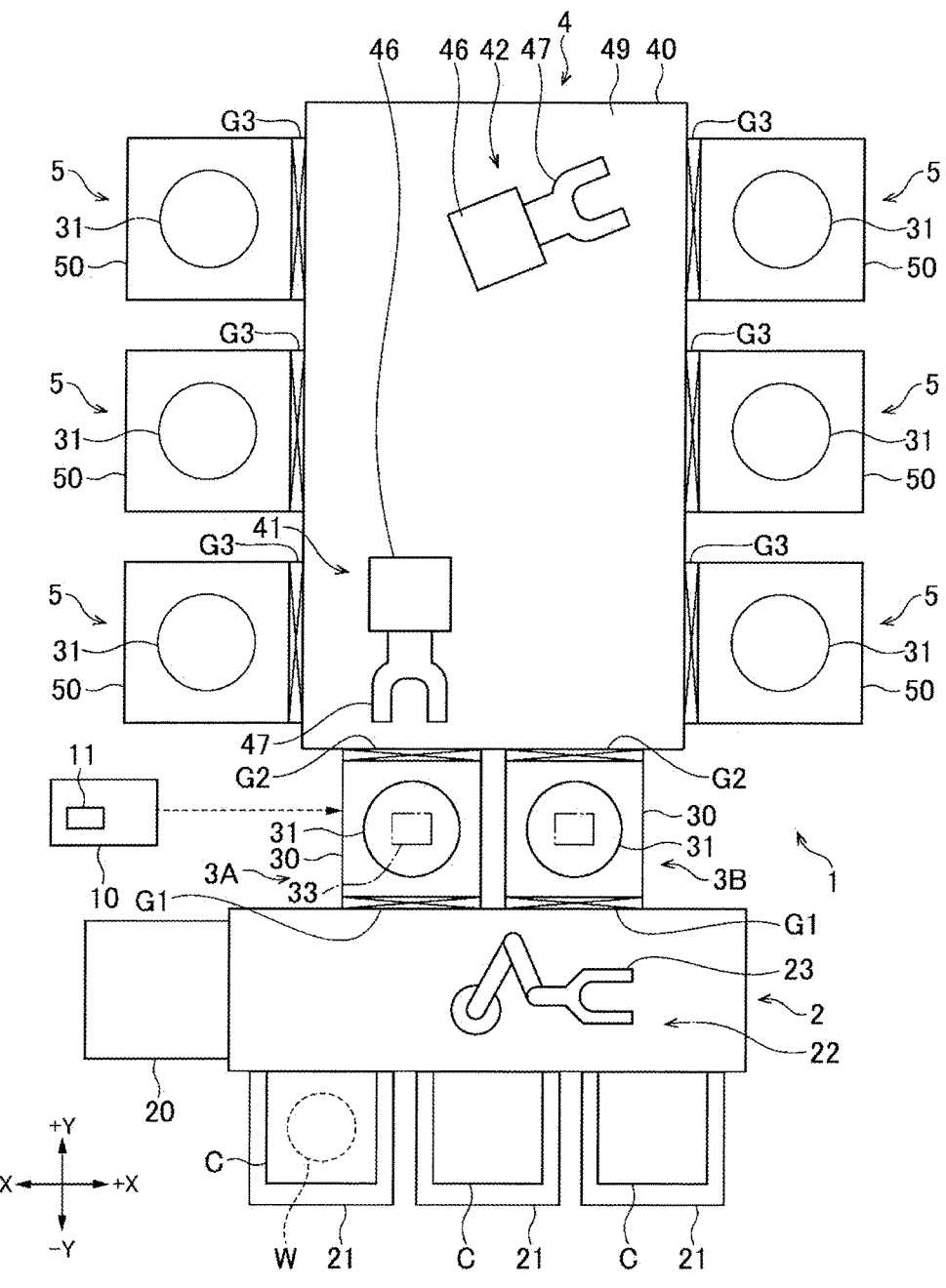
FIG. 1 is a plan view of a substrate processing apparatus to which a substrate transfer apparatus according to an embodiment of the present disclosure is applied.

FIG. 1 shows a substrate processing apparatus 1 including a substrate transfer apparatus that is an embodiment of the present disclosure. The substrate processing apparatus 1 is installed in an atmospheric atmosphere and includes a loader module 2, an alignment module 20, load-lock modules 3A and 3B, a vacuum transfer module 4, and six process modules 5. In each process module 5, a wafer W that is a circular substrate is processed in a vacuum atmosphere.

The loader module 2, which is referred to as "equipment front end module (EFEM)", loads and unloads the wafer W into and from a transfer container C referred to as "front open unified pod (FOUP)" in which wafers W are stored. A wafer W unloaded from the transfer container C is loaded into the substrate processing apparatus 1. The loader module 2 is elongated horizontally, and has an inner atmosphere maintained at an atmospheric pressure and a normal pressure. Hereinafter, the length direction of the loader module 2 will be defined as the X direction, and the direction perpendicular to the X direction will be defined as the Y direction. The X and Y directions are horizontal directions. One side and the other side in the X direction are defined as the +X side and the −X side, respectively, and one side and the other side in the Y direction are defined as the +Y side and the −Y side, respectively.

On the −Y side of the loader module 2, three container placement tables 21, each having the transfer container C placed thereon, are arranged side by side in the X direction, for example. A transfer mechanism 22 is disposed in the loader module 2. The transfer mechanism 22 is not magnetically levitated, unlike transfer bodies 41 and 42 to be described later. The transfer mechanism 22 is configured as a multi joint arm capable of moving up and down and in the X direction, for example, and includes an end effector 23 for supporting the backside of the wafer W. The transfer mechanism 22 transfers the wafer W between the transfer containers C on the container placement tables 21, the load-lock modules 3A and 3B, and the alignment module 20.

The alignment module 20 is connected to the loader module 2 on the −X side. The alignment module 20 optically detects the orientation and center position of the wafer W. When the transfer mechanism 22 receives the wafer W from the alignment module 20, the operation of the transfer mechanism 22 is controlled by a controller 10 to be described later such that the center position of the wafer W is positioned at a predetermined position on the end effector 23 in a state where the wafer W is oriented in a predetermined direction.

Figure 2:
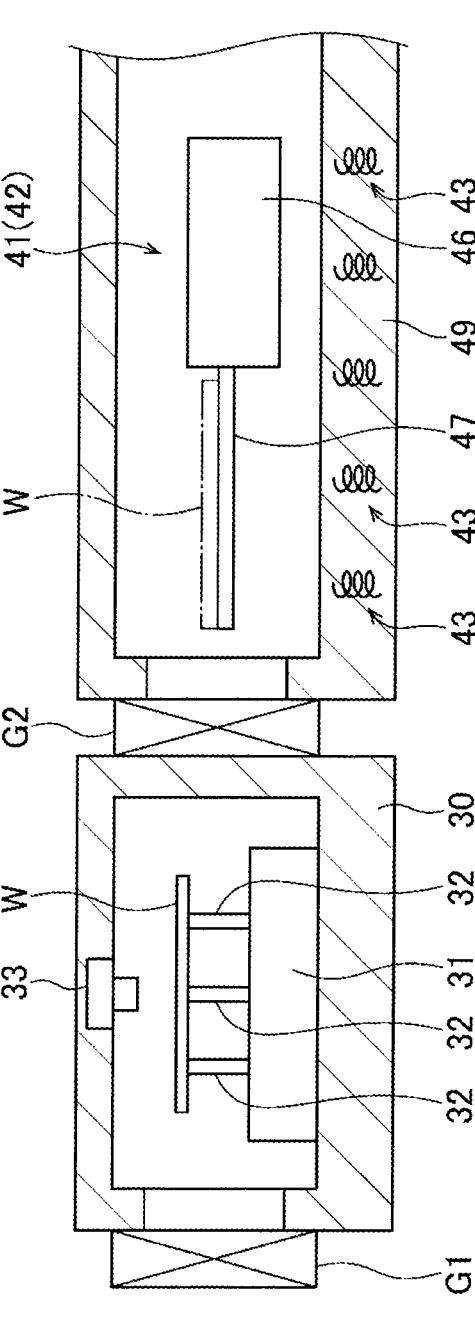
FIG. 2 is a longitudinal side view of the substrate processing apparatus.

The load-lock modules 3A and 3B are disposed on the +Y side of the loader module 2, and the load-lock modules 3A and 3B are spaced apart from each other in the X direction. The load-lock module 3A serving as a detection device will be described with reference to FIG. 2 that is a longitudinal side view. The load-lock module 3A has a housing 30. A gas supply mechanism and an exhaust mechanism are disposed to supply $N_2$ (nitrogen) gas into the housing 30 and to perform an exhaust operation, respectively. The inner atmosphere of the housing 30 can be switched between a normal pressure atmosphere that is an $N_2$ gas atmosphere and a vacuum atmosphere.

A circular stage 31 is disposed in the housing 30 in plan view, and the wafer W is placed horizontally on the upper surface of the stage 31. The stage 31 is provided with three lift pins 32 capable of projecting from and retracting below the upper surface of the stage 31 while moving up and down. The wafer W can be transferred between the stage 31, the transfer mechanism 22, and the transfer bodies 41 and 42 (to be described later) disposed in the vacuum transfer module 4 via the lift pins 32.

A camera 33 is disposed at a ceiling portion of the housing 30 to be positioned above the stage 31. The field of view of the camera 33 is directed downward to obtain planar image data of a support 47 of the transfer bodies 41 and 42 (to be described later) moving on the stage 31 and the wafer W supported by the support 47. The image data is transmitted to the controller 10 and used for teaching the transfer bodies 41 and 42. This will be described in detail later. The load-lock module 3B has the same configuration as that of the load-lock module 3A except that the camera 33 is not provided. A door valve G1 is interposed between the housing 30 of each of the load-lock modules 3A and 3B and the loader module 2, so that the inner atmosphere of the loader module 2 and the inner atmosphere of the housing 30 can be separated from each other.

The vacuum transfer module 4 is connected to the +Y side of the load-lock modules 3A and 3B. The vacuum transfer module 4 has a housing 40. The housing 40 has an inner space serving as a substrate transfer area, and is exhausted to a vacuum atmosphere by an exhaust mechanism (not shown). The transfer bodies 41 and 42 for transferring the wafer W are disposed in the housing 40. This will be described in detail later. A gate valve G2 is interposed between the housing 30 of each of the load-lock modules 3A and 3B and the housing 40 of the vacuum transfer module 4, so that the inner atmosphere of the housing 30 and the inner atmosphere of the housing 40 can be separated from each other.

Hereinafter, the six process modules 5 will be described. Each process module 5 has a processing container 50, and the processing container 50 is exhausted to a vacuum atmosphere by an exhaust mechanism (not shown). The stage 31 is disposed in the processing container 50, similarly to the load-lock modules 3A and 3B, and is provided with lift pins 32 on which the wafer W is placed. The stage 31 in the process module 5 has, as a temperature controller, a heater or a flow path through which a fluid having a temperature controlled by a chiller flows, for example, in order to perform processing while adjusting a temperature of the wafer W placed thereon to a desired temperature.

Further, the processing container 50 is provided with a gas supply device (not shown) such as a gas shower head or the like, and a processing gas is supplied into the processing container 50 maintained in a vacuum atmosphere. The wafer W placed on the stage 31 and having a controlled temperature is exposed to the processing gas, and is processed by the processing gas. The processing may include etching, film formation, annealing, or the like. A plasma generating mechanism may be provided so that plasma is produced from the processing gas and used for processing.

In this example, three process modules 5 are connected to the vacuum transfer module 4 on the −X side and three process modules 5 are connected to the vacuum transfer module 4 on the +X side. The three process modules 5 on the −X side and the three process modules 5 on the +X side are arranged side by side in the Y direction. A gate valve G3 is interposed between the processing container 50 of each process module 5 and the housing 40 of the vacuum transfer module 4, so that the inner atmosphere of the housing 40 and the inner atmosphere of the processing container 50 can be separated from each other.

The door valve G1 and the gate valves G2 and G3 described above are closed except when the wafer W is transferred between modules and when the transfer bodies 41 and 42 access the module to perform teaching to be described later during the operation of the substrate processing apparatus 1, so that the atmospheres between the modules are separated. Therefore, the pressures in the housings 30 of the load-lock modules 3A and 3B are changed in a state where the door valve G1 and the gate valve G2 are closed. The processing in each process module 5 is performed in a state where the processing container 50 is isolated from the vacuum transfer module 4 by closing the gate valve G3.

The load-lock modules 3A and 3B, the vacuum transfer module 4, and the six process modules 5, which can be exhausted to a vacuum atmosphere, are independently exhausted. Due to the independent exhaust operations of the modules, it is possible to perform an operation to be described later in a state where the processing container 50 of the process module 5 is maintained in a vacuum atmosphere and the housing 40 of the vacuum transfer module 4 is maintained in an atmospheric atmosphere.

Figure 3:
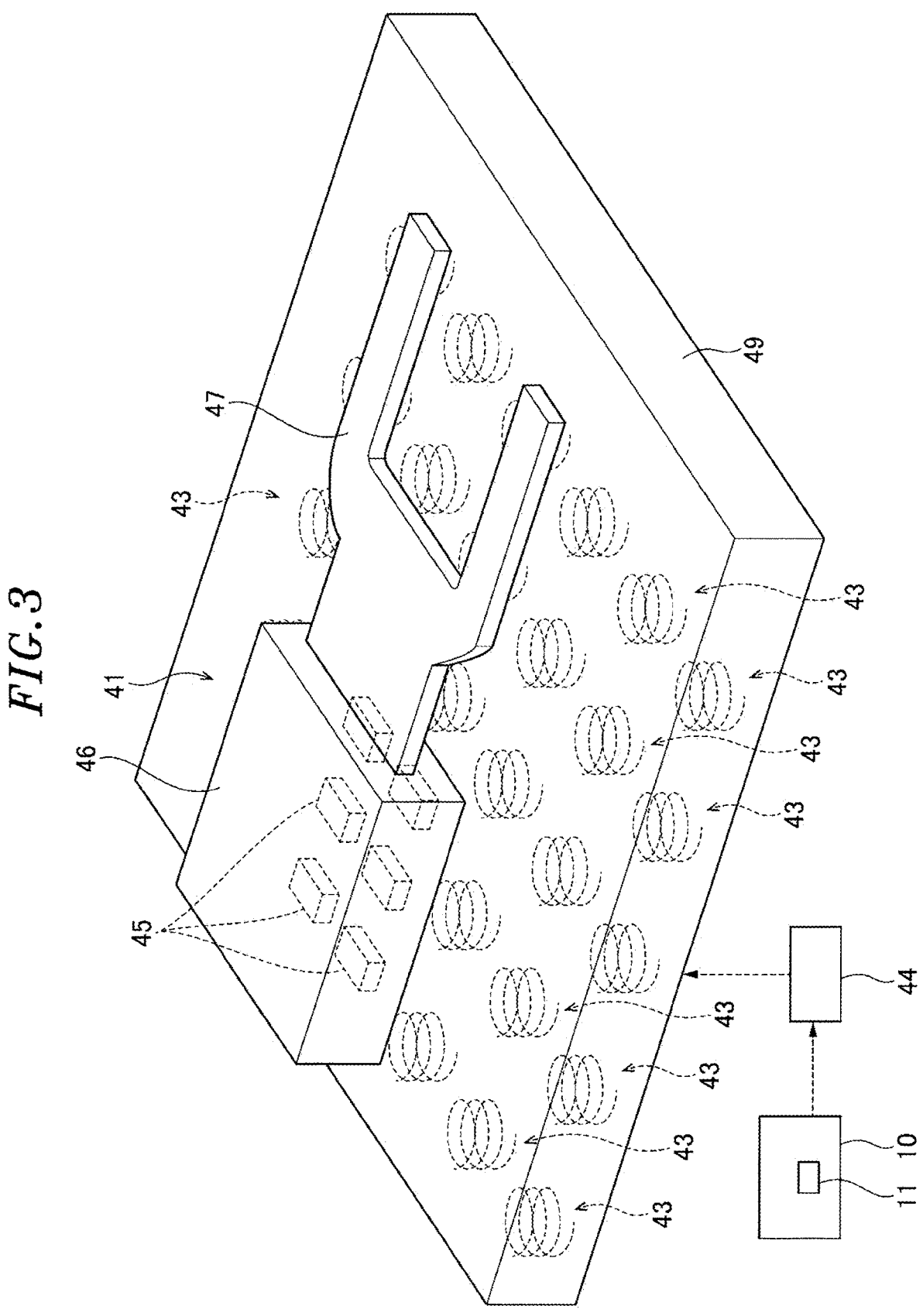
FIG. 3 is a perspective view of a transfer body and a bottom portion of a housing in the substrate processing apparatus.

Next, the vacuum transfer module 4 will be described in more detail with reference to the perspective view of FIG. 3 as well.

The transfer body 41 that is a first transfer body and the transfer body 42 that is a second transfer body, which are disposed in the housing 40 serving as the substrate transfer area, are moved horizontally while floating from a floor 49 (i.e., a bottom portion of the substrate transport area) in the housing 40 by a magnetic force, thereby transferring the wafer W. Since the wafer W moves in a floating state, dust generation is prevented. Accordingly, it is possible to maintain the inside of the vacuum transfer module 4 and the inside of the process module 5 in a clean state, and also possible to suppress the occurrence of abnormal processing due to adhesion of foreign substances to the wafer W. As schematically shown in FIG. 3, a plurality of coils 43 are embedded in the floor 49 while being distributed in the horizontal direction. A power is individually supplied from a power supply device 44 to the coils 43, and the coils 43 generate a magnetic field around themselves with an intensity corresponding to the supplied power. In other words, each coil 43 acts as an electromagnet.

The movements of the transfer bodies 41 and 42 using the magnetic field are individually controlled. The transfer bodies 41 and 42 have the same configuration, so that the transfer body 41 shown in FIG. 3 will be described as a representative example. The transfer body 41 includes a moving body 46 having therein magnets 45, e.g., permanent magnets. The magnets 45 and the energized coil 43 repel each other by the magnetic force, so that the transfer body 41 floats from the floor 49. By controlling the magnetic field on the floor 49 by switching the coils 43 to which the power is supplied or adjusting the amount of power to be supplied, it is possible to move the transfer body 41 in a floating state in the X and Y directions, change the direction, stop the movement, and change a floating height from the floor 49. Here, the movement in the X and Y directions include both separate movement in the X and Y directions and simultaneous movement in the X and Y directions.

The support 47 for horizontally supporting the wafer W from the bottom surface thereof is disposed at a side portion of the moving body 46. The support 47 can be positioned on the stage 31 of each of the load-lock modules 3A and 3B and the stage 31 of the process module 5 by the movement of the moving body 46. Therefore, the wafer W can be transferred between the stage 31 and the support 47 using the lift pins 32. In this example, the support 47 has a bifurcated fork shape to avoid interference with the lift pins 32 during the transfer operation.

Hereinafter, the transfer path of the wafer W in the substrate processing apparatus 1 will be described. The wafer W loaded into the loader module 2 from the transfer container C is transferred in the order of the alignment module 20→ the loader module 2→ the load-lock module 3A→ the vacuum transfer module 4. The wafer W processed in the process module 5 is transferred in the order of the vacuum transfer module 4→ the load-lock module 3B→ the loader module 2→ the transfer container C. Hereinafter, the transfer between the vacuum transfer module 4 and the process module 5 will be described in more detail. The wafer W may be transferred to only one of the six process modules 5 and processed. Alternatively, the wafer W may be sequentially transferred to multiple process modules 5 among the six process modules 5 and processed. In the case of transferring the wafer W between the vacuum transfer module 4, the process modules 5, and the load-lock modules 3A and 3B, any one of the transfer bodies 41 and 42 can be used.

In order to transfer and process the wafer W, teaching (operation teaching) of the transfer bodies 41 and 42 is performed. Hereinafter the teaching will be described. As described above, the wafer W is transferred between the stage 31 of each module accessed by the transfer bodies 41 and 42 and the support members 47 of the transfer bodies 41 and 42. More specifically, the transfer of the wafer W onto the stage 31 by the transfer bodies 41 and 42 via the lift pins 32 and the reception of the wafer W from the stage 31 by the transfer bodies 41 and 42 via the lift pins 32 are performed. Briefly, the teaching of the transfer bodies 41 and 42 is an operation of determining the positions of the transfer bodies 41 and 42 in transferring the wafer W.

Figure 4:
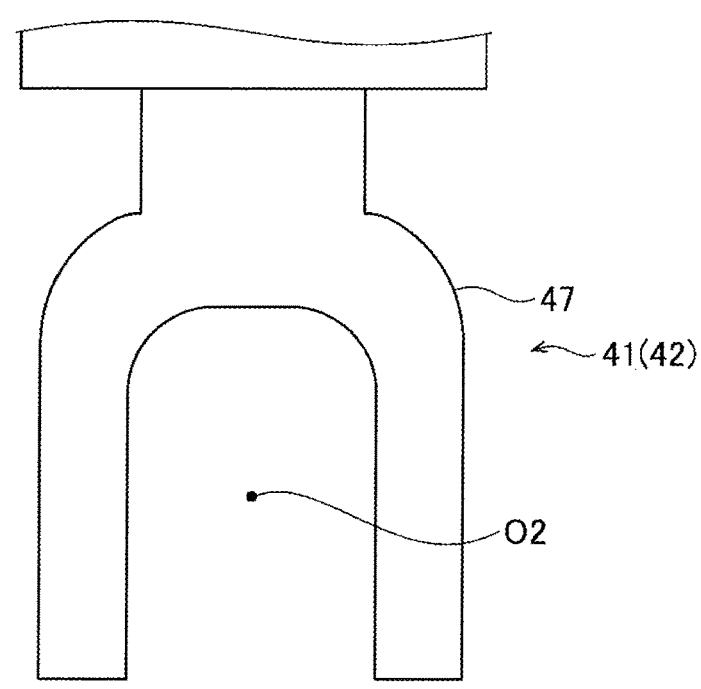
FIG. 4 is a plan view showing the transfer body, a substrate, and a stage on which the substrate is placed.
Figure 4:
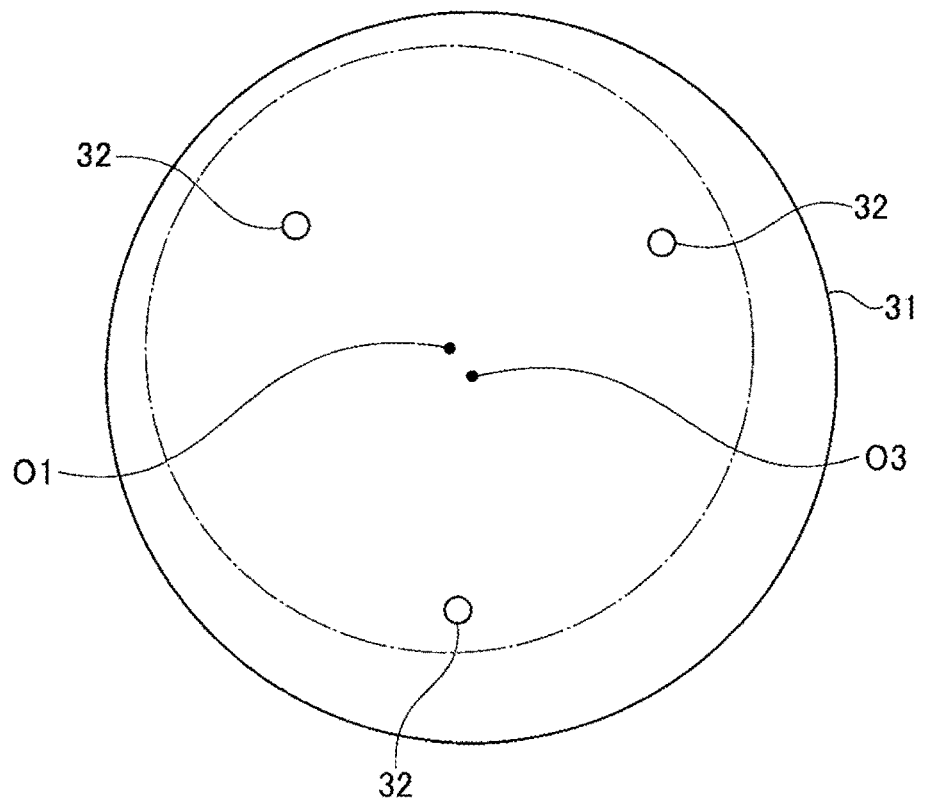

This will be described in more detail with reference to the plan view of FIG. 4. In FIG. 4, a center point O1 indicates the center position of the wafer W. A support center point O2 indicates a predetermined position of the transfer body 41 (or 42) on the support 47. The support center point O2 coincides with the center point O1 of the wafer W in plan view when the wafer W is normally placed on the support 47. A placement center point O3 indicates the center of the upper surface of the stage 31.

By performing teaching, the positions of the transfer bodies 41 and 42 in transferring the wafer W are determined such that the support center point O2 of each of the transfer bodies 41 and 42 coincides with the placement center point O3 of the stage 31 in plan view. Since the positions of the transfer bodies 41 and 42 are determined in this manner, the wafer W is placed on the stage 31 such that the center point O1 coincides with the placement center point O3 and the wafer W is received by the support 47 such that the center point O1 coincides with the support center point O2 in plan view. Therefore, when an XY coordinate system including the X-axis corresponding to the X direction and the Y-axis corresponding to the Y direction is set in the process module 5 and the vacuum transfer module 4, the teaching of the transfer bodies 41 and 42 corresponds to the operation of determining the coordinate positions of the support center point O2 of the transfer bodies 41 and 42 in the XY coordinate system. The teaching is performed for each module accessed by the transfer bodies 41 and 42 so that the wafer W can be placed on the stage 31 of each process module 5 such that the center point O1 of the wafer W coincides with the center point O3 of the stage 31 and appropriately processed.

As described above, the transfer bodies 41 and 42 have the same configuration. However, the transfer bodies 41 and 42 have unavoidable manufacturing shape errors and differences in the characteristics of the magnets 45. When the same magnetic field is generated under the transfer bodies 41 and 42, even if the shape errors are small, the positions of the support center points O2 may be misaligned due to the difference in the characteristics of the magnets 45. In other words, the transfer bodies 41 and 42 may have individual differences due to a magnetic levitation structure. Hence, the teaching is performed for each of the transfer bodies 41 and 42.

Hereinafter, the controller 10 shown in FIGS. 1 and 3 will be described. The controller 10 is a computer, and has a program and a memory 11. The program has a group of steps to output a control signal to individual components of the substrate processing apparatus 1 and control the operations of the individual components so that the above-described operations of transferring and processing the wafer W and automatic teaching to be described later can be performed. The program is stored in the controller 10 while being stored in a storage medium such as a hard disk, a compact disk, a DVD, a memory card, or the like.

The memory 11 stores data (position data) for determining the transfer positions of the transfer bodies 41 and 42 for each module to be accessed. In other words, when the transfer bodies 41 and 42 transfer the wafer W to the module, the operations of the transfer bodies 41 and 42 are controlled (i.e. the magnetic field on the floor 49 is controlled) such that the transfer bodies 41 and 42 are moved to the positions corresponding to the position data for the module. Although the teaching of the transfer bodies 41 and 42 has been described as the process of determining the position for transferring the wafer W to the module, more specifically, the teaching is a process of acquiring the position data in which the support center point O2 coincides with the center point O3 in plan view and storing the position data in the memory 11. As described in FIG. 3, the positions of the transfer bodies 41 and 42 are changed by the change in the magnetic field on the floor 49, so that the position data includes, e.g., data on the amount of power supplied to each coil 43 among the plurality of coils 43.

Figure 5:
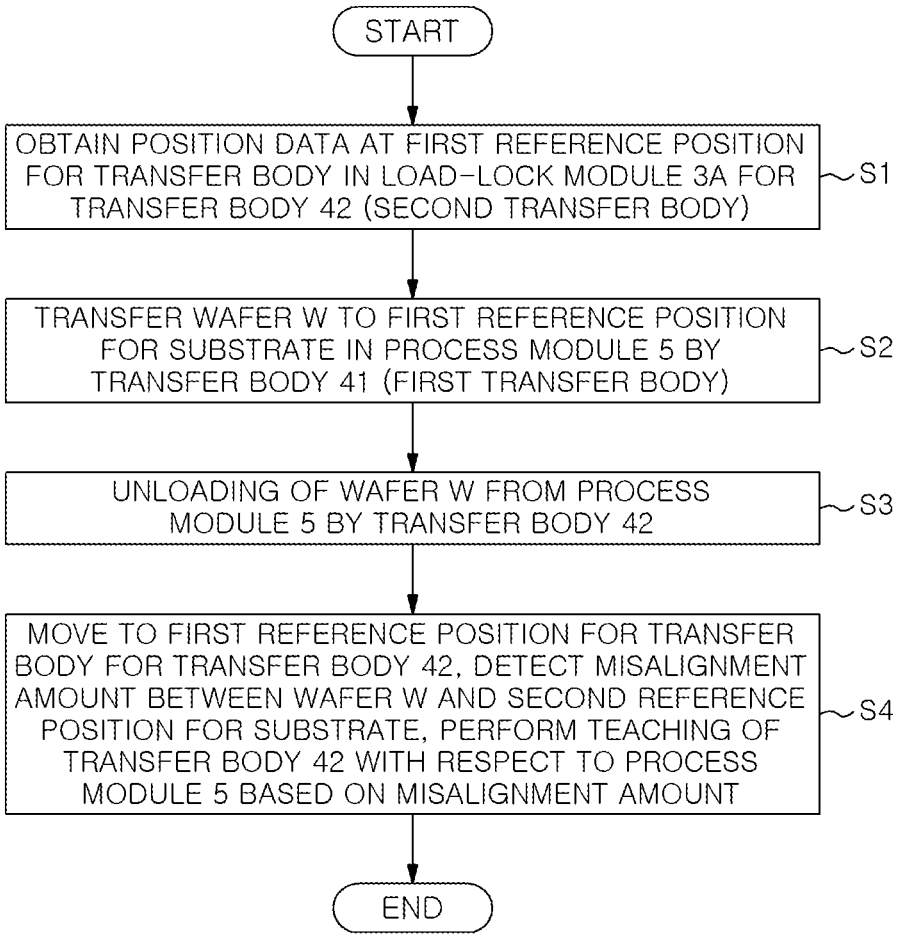
FIG. 5 is a flowchart showing processes for completing teaching of the transfer body with respect to a process module 5.

In the substrate processing apparatus 1, after an operator performs teaching of one of the transfer bodies 41 and 42, the teaching of the other transfer body can be automatically performed. Since the teaching is automatically performed, the teaching can be performed during the operation of the substrate processing apparatus 1, i.e., in a state where the housing 40 of the vacuum transfer module 4 and the processing container 50 of each process module 5 are maintained in a vacuum atmosphere. The object to be subjected to automatic teaching may be any one of the transfer bodies 41 and 42. Hereinafter, the sequence of the automatic teaching of the transfer body 42 will be described with reference to the flowchart of FIG. 5 (the following steps S1 to S4) and the plan views of FIGS. 6 to 10. In the following description, for convenience of description, the process module located on the most+Y side among the three process modules 5 on the +X side will be referred to as a process module 5A.

First, for example, the housing 40 of the vacuum transfer module 4 and the processing container 50 of each process module 5 are opened to the outside of the apparatus and set to an atmospheric atmosphere, and the substrate processing apparatus 1 is in a non-operating state. In this state, an operator performs manual teaching of the transfer body 41. In other words, the position data (second data) of the transfer body 41 with respect to the process modules 5 and the load-lock modules 3A and 3B are acquired and stored in the memory 11.

Further, the operator performs teaching of the transfer mechanism 22 of the loader module 2 by any method so that the wafer W is appropriately transferred to the transfer container C and each module accessed by the transfer mechanism 22. Further, temporary position data is stored, as the position data for each module in the transfer body 42, in the memory 11 of the controller 10. In other words, the transfer body 42 can move to the temporary position for transferring the wafer W. In addition, the position of the placement center point O3 of the stage 31 is specified in the image data acquired by the camera 33 of the load-lock module 3A.

Next, the housing 40 of the vacuum transfer module 4 and the processing container 50 of each process module 5 are evacuated to a vacuum atmosphere, and the substrate processing apparatus 1 operates. Then, the transfer body 42 moves to the temporary position for transferring the wafer W to the load-lock module 3A at a random timing based on the temporary position data stored for the load-lock module 3A. Accordingly, the support 47 of the transfer body 42 is positioned on the stage 31 of the load-lock module 3A, and the camera 33 performs imaging to obtain the planar image data of the support 47.

The controller 10 sequentially performs the detection of the support 47 in the image data, the specification of the support center point O2, and the calculation of the misalignment amounts in the X and Y directions between the support center point O2 and the placement center point O3 of the stage 31. Then, the position data for the load-lock module 3A in the memory 11 is updated to correct the misalignment in the X and Y directions (i.e., the temporary position data is changed to regular position data). In other words, the position of the transfer body 42 in transferring the wafer W to the load-lock module 3A is corrected such that the support center point O2 and the placement center point O3 coincide with each other in plan view, and teaching of the transfer body 42 with respect to the load-lock module 3A is completed (see FIG. 6, step S1). The step S1 corresponds to a first determination process of determining a first reference position for a transfer body (first transfer body reference position), and the position where the support center point O2 coincides with the placement center point O3 is the first reference position for the transfer body. The position data updated in step S1 is first data.

Next, the wafer W is transferred from the transfer container C to any one of the load-lock modules 3A and 3B through the loader module 2. In this example, the wafer W is transferred to the load-lock module 3A. Since the teaching of the transfer mechanism 22 has been completed as described above, the wafer W is transferred such that the center point O1 of the wafer W coincides with the placement center point O3 of the load-lock module 3A. The wafer W thus transferred is received by the transfer body 41 and transferred to the process module 5A. Since the teaching of the transfer body 41 has been completed, the transfer body 41 is moved to a position (second reference position for a transfer body, second transfer body reference position) where the support center point O2 coincides with the placement center point O3 of the process module 5A in plan view.

The lift pins 32 of the stage 31 of the process module 5A are raised, and the wafer W is supported by the lift pins 32 instead of the transfer body 41 (step S2). Since the teaching of the transfer body 41 has been completed as described above and the transfer body 41 receives the wafer W whose center point O1 coincides with the placement center point O3 in the load-lock module 3A, the center point O1 of the wafer W supported on the lifting pins 32 coincides with the placement center point O3 of the stage 31 in plan view (see FIG. 7). The position of the wafer W at this time is a first reference position for a substrate (first substrate reference position).

The transfer body 41 retracts from the process module 5A. Then, the transfer body 42 moves to a temporary position for transferring the wafer W to the process module 5A based on the temporary position data stored for the process module 5A, and the support 47 of the transfer member 42 is positioned below the wafer W. Thereafter, the lifting pins 32 are lowered, and the wafer W is supported by the supporting member 47 instead of the lifting pins 32 (see FIG. 8, step S3).

Next, the transfer body 42 supporting the wafer W moves to a position for transferring the wafer W to the load-lock module 3A. Specifically, since the teaching of the transfer body 42 with respect to the load-lock module 3A has been completed in step S1, the transfer body 42 is located at the position (the first reference position for a transfer body) where the support center point O2 and the placement center point O3 of the stage 31 coincide with each other in plan view (see FIG. 9). Then, the camera 33 performs imaging to obtain the planar image data of the wafer W supported by the support 47.

The controller 10 calculates the center point O1 of the wafer W in the image data, and calculates the misalignment amount of the center point O1 with respect to the placement center point O3 of the stage 31 in the X and Y directions, for example. In the case of setting the position of the wafer W where the central point O1 coincides with the placement central point O3 in plan view to a second reference position for a substrate (second substrate reference position), when the teaching of the transfer body 42 with respect to the process module 5A has been performed, the wafer W coincides with the second reference position. Therefore, the calculation of the misalignment amount of the center point O1 of the wafer W with respect to the placement center point O3 using the image data is the calculation of the misalignment amount between the wafer W located at the predetermined second reference position and the wafer W located at the actual position.

The misalignment amount calculated from the image data (the misalignment amount of the wafer W) corresponds to the misalignment amount of the support center point O2 of the transfer body 42 with respect to the center point O1 of the wafer W in plan view at the time of executing the step S3. As described above, in the process module 5A, the center point O1 of the wafer W coincides with the placement center point O3, so that the misalignment amount of the wafer W corresponds to the misalignment amount of the support center point O2 of the transfer body 42 with respect to the placement center point O3 in plan view. The controller 10 calculates the misalignment amount between the placement center point O3 and the support center point O2 as the misalignment amount of the transfer position.

Figure 11:
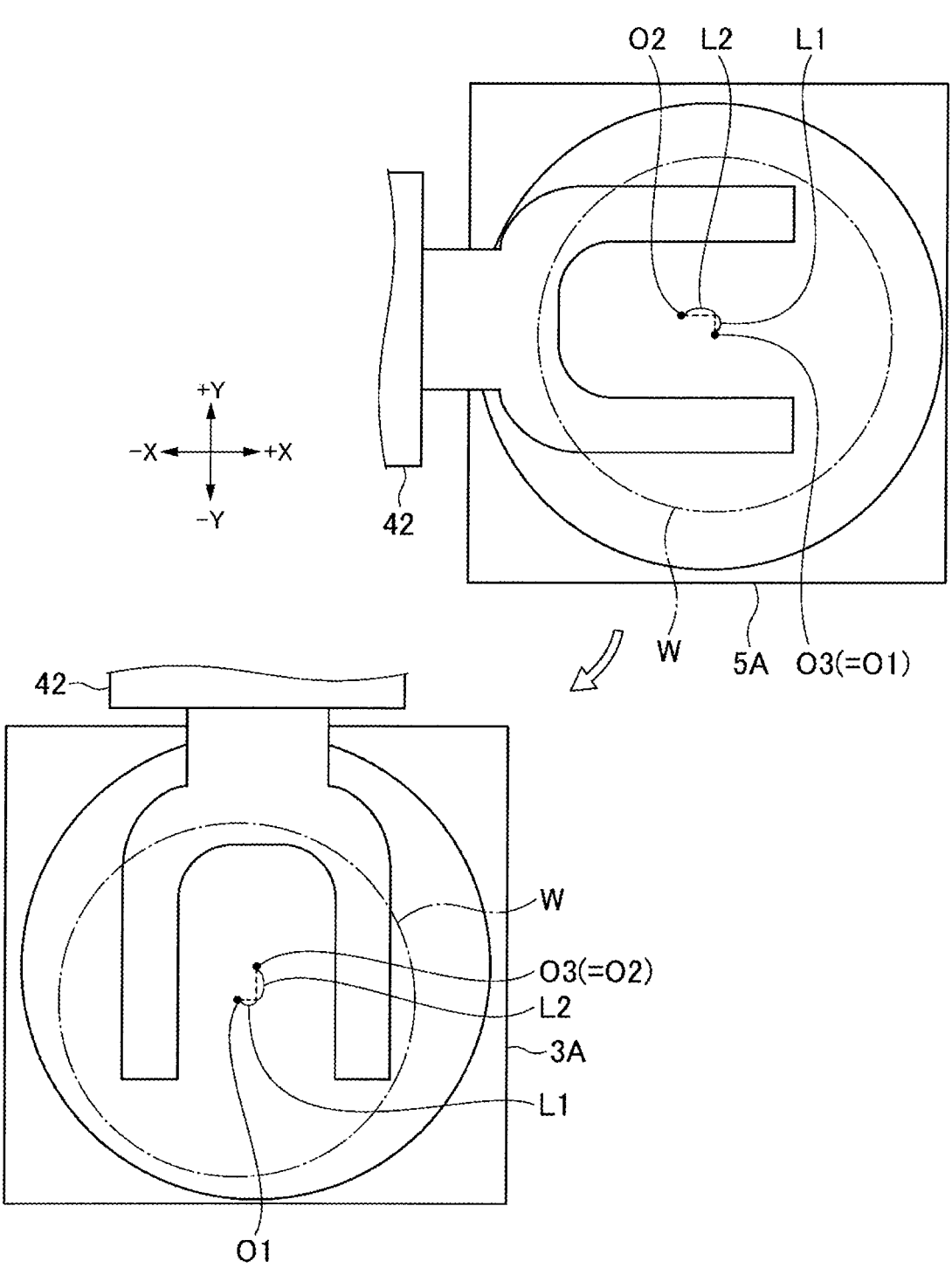
FIG. 11 is a plan view of the transfer body and illustrates position correction of the transfer body that is performed by teaching.

The calculation of the misalignment amount of the transfer position will be described using a specific example shown in FIG. 11. FIG. 11 is a plan view showing both the transfer body 42 at the time of receiving the wafer W from the process module 5A in step S3 and the transfer body 42 at the time of acquiring the image data in the load-lock module 3A in step S4. As shown in FIG. 11, the misalignment amount of the wafer W obtained from the image data (the misalignment amount of the center point O1 of the wafer W with respect to the placement center point O3 of the load-lock module 3A) is L1 in the −X direction and L2 in the −Y direction.

According to the positional relationship of the load-lock module 3A and the process module 5A with respect to the vacuum transfer module 4, the orientation of the transfer body 42 at the time of receiving the wafer W is different from that at the time of performing imaging by 90°. Due to the difference in the orientation of the transfer body 42 and the misalignment amount of the wafer W obtained from the image data, when the wafer W is received from the process module 5A, the support center point O2 of the transfer body 42 is misaligned with the placement center point O3 (=center point O1 of wafer W) by L2 in the −X direction and by L1 in the +Y direction. The values of L2 in the −X direction and L1 in the +Y direction are calculated as the misalignment amount of the transfer position.

The position data for the process module 5A is updated to eliminate the misalignment amount of the transfer position. In other words, the temporary position data is changed to the regular position data based on the misalignment amount of the wafer W, thereby completing the teaching of the transfer body 42 with respect to the process module 5A (step S4). Specifically, as shown in FIG. 11, for example, when the misalignment amount of the transfer position is L2 in the −X direction and L1 in the +Y direction, the support center point O2 of the transfer body 42 at the time of transferring the wafer W is shifted by L2 in the +X direction and L1 in the —Y direction, so that the position data is updated such that the support center point O2 of the transfer body 42 coincides with the placement center point O3 of the process module 5A.

Next, the steps S2 to S4 are executed for the load-lock module 3B and other process modules 5 other than the process module 5A accessed by the transfer body 42, and the teaching for the modules is sequentially performed. Depending on the modules as teaching targets, the relationship of the orientation the transfer body 42 at the time of receiving the wafer W in step S3 and that at the time of performing imaging in step S4 may be different from that of the process module 5A described in FIG. 11. In that case, the misalignment amount of the transfer position in step S4 is calculated in consideration of the difference in the relationship of the orientation, and the teaching is performed.

Figure 10:
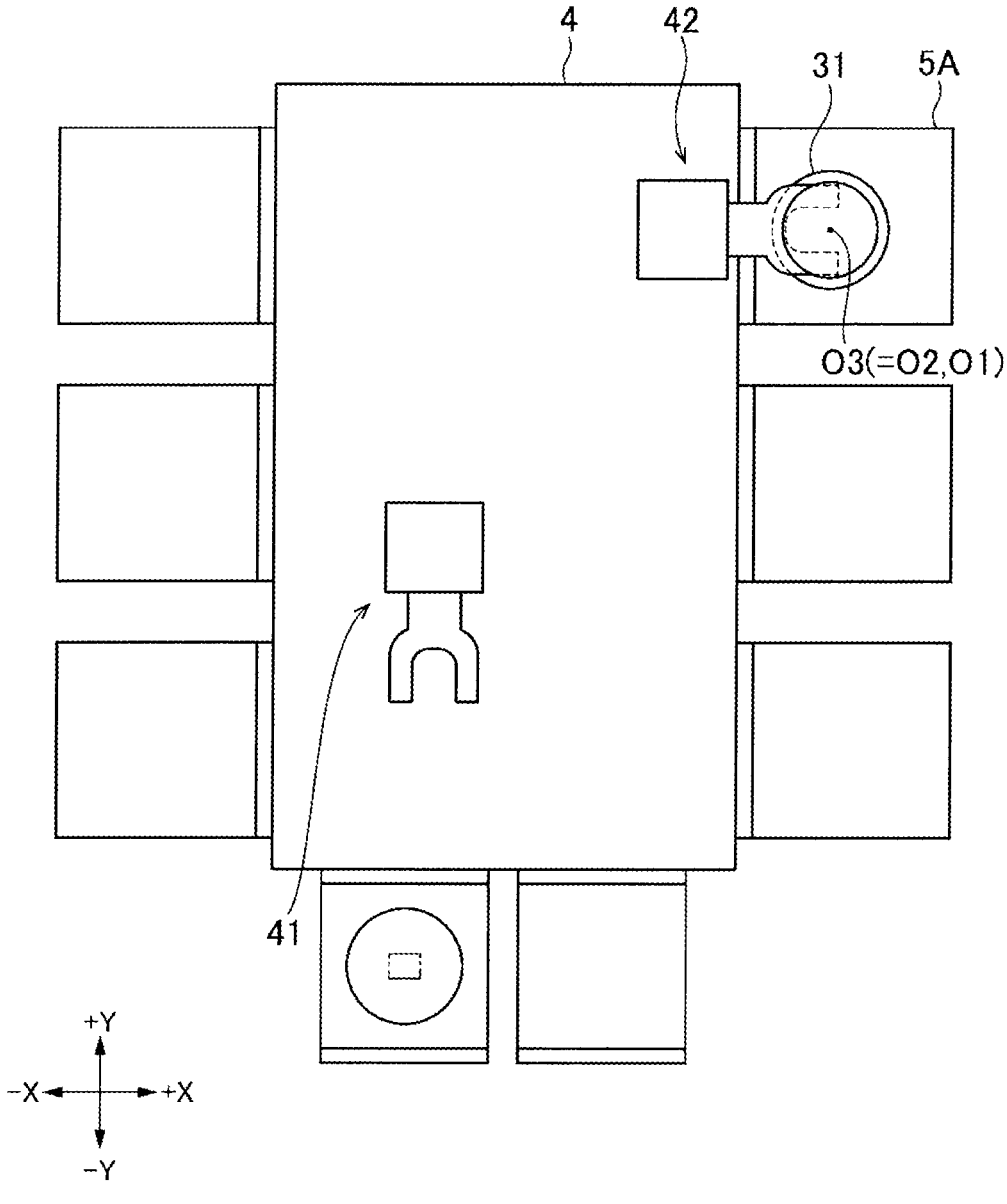
FIG. 10 is a plan view of the substrate processing apparatus and illustrates teaching of the transfer body.

When the position data is updated by executing the steps S2 to S4 for all modules accessed by the transfer body 42, the teaching of the transfer body 42 is completed. After the completion of the teaching, when the transfer body 42 transfers the wafer W between the modules, the center point O1 of the wafer W coincides with the placement center point O3 of each module in plan view. FIG. 10 shows a state in which the wafer W is transferred to and from the process module 5A.

The steps S2 and S3 correspond to the transfer process and the receiving process, respectively. The processes up to the calculation of the misalignment amount of the transfer position in step S4 corresponds to the detection process, and the subsequent updating of the position data corresponds to the correction process. Each of the misalignment amount of the wafer W and the misalignment amount of the transfer position obtained in step S4 is the data indicating the positional relationship in plan view between the first reference position for a substrate and the second transfer body at the time of performing the receiving process.

As described above, it is required to perform teaching of each of the transfer bodies 41 and 42. However, in the substrate processing apparatus 1, the teaching of one of the transfer bodies 41 and 42 is automatically performed, so that the man-hours or time required by an operator to perform teaching can be reduced. The configuration of the substrate processing apparatus 1 may be changed appropriately, and the number of modules connected to the vacuum transfer module may be increased or decreased appropriately. Although the teaching is performed for the modules accessed by the transfer bodies 41 and 42, an operator performs manual teaching of only one of the transfer bodies 41 and 42, so that the burden on the operator can be reduced even when there are a large number of modules.

Although the case in which the wafer W supported on the lift pins 32 of the module in step S2 is received by the transfer body 42 in step S3 without being placed on the stage 31 has been described, the wafer W may be placed on the stage 31 by lowering the lift pins 32. In other words, in step S3, the wafer W processed in the process module 5 may be placed on the stage 31 and received. In other words, the wafer W may be processed during the execution of the steps S1 to S4. Further, in the steps S1 to S4, it is not necessary to use the wafer W that is a substrate for manufacturing a semiconductor device, and it is also possible to use a substrate, such as a dummy wafer or the like, that has the same planar shape as that of the wafer W and is not intended for manufacturing a semiconductor device.

Although the case of performing teaching for the process module 5A by sequentially executing the steps S1 to S4 has been described, the teaching of the transfer body 42 with respect to the load-lock module 3A may be performed until the transfer body 42 receives the wafer W from the process module 5A. Therefore, the step S2 may be performed before the step S1.

Although it is preferable to perform all the steps S1 to S4 automatically as described above, the teaching of the transfer body 42 with respect to the load-lock module 3A in step S1, for example, may be manually performed by an operator, similarly to the case of performing teaching of the transfer body 41. However, even if the step S1 is performed manually, the number of modules as manual teaching targets increases by only one, which makes it possible to sufficiently reduce the burden on the operator.

Although the teaching performed at the start of the operation of the substrate processing apparatus 1 has been described, the same teaching is performed at the time of performing maintenance after the operation of the substrate processing apparatus 1. Hereinafter, the sequence of operations including teaching in the case of performing maintenance, e.g., in the case of replacing the transfer body 42 during the operation of the apparatus, will be described.

First, in a state where the gate valves G2 and G3 are closed, the evacuation of the housing 40 of the vacuum transfer module 4 is stopped, and the pressure in the housing 40 is returned from a preset vacuum level (hereinafter, referred to as "vacuum pressure for transfer") for transferring the wafer W to an atmospheric pressure. An operator removes a part of the partition wall constituting the housing 40 and accesses the housing 40 from the outside of the apparatus to replace the transfer body 42. Then, the housing 40 is exhausted to the vacuum pressure for transfer again. Since the transfer bodies have individual differences as described above, the teaching is required for a newly used transfer body 42. Thereafter, the steps S1 to S4 are executed similarly to the case of starting the operation of the apparatus, thereby performing teaching.

The operation stop of the process module 5 and the exposure of the processing container 50 of each process module 5 to the atmosphere by the replacement of the transfer body 42 and the execution of steps S1 to S4 are not carried out, and the process module 5 operates until the vacuum transfer pressure is released and restored. Specifically, the operation of the process module 5 indicates that the temperature of the stage 31 in the processing container 50 is maintained at the same temperature as that during the processing of the wafer W, or the pressure in the processing container 50 is maintained at a vacuum pressure. By operating the process module 5 in this manner and maintaining the processing environment of the wafer W in the processing container 50, it is possible to quickly transfer the wafer W to the process module 5 after the pressure in the vacuum transfer module 4 is restored to the transfer vacuum pressure and to resume the processing. In the case of releasing the transfer vacuum pressure, if the wafer W is being processed in the processing container 50, the processing is continued. When the transfer vacuum pressure is restored, the processed wafer W may be taken out from the processing container 50.

Since the teaching of the transfer body 42 with respect to the process modules 5 can be performed without setting the processing container 50 to an atmospheric atmosphere, it is not necessary to stop the operation of each process module 5 in the case of performing steps S1 to S4 as described above. Therefore, even in the case of the apparatus configuration in which the frequency of exchange of the transfer bodies 41 and 42 is relatively high, it is possible to avoid an increase in the length of time in which the processing in each process module 5 is not be performed. Further, although the number of process modules 5 provided in the substrate processing apparatus 1 can be increased or decreased appropriately, when the number of process modules 5 is relatively large, the nonstop operation of the process modules 5 is particularly effective in ensuring the productivity of the apparatus.

Hereinafter, modifications of steps S1 to S4 will be described. Unless otherwise specified, it is assumed that the transfer body as a teaching target is the transfer body 42 as in the above-described example. A modification of the step S1 (teaching of the transfer body 42 with respect to the load-lock module 3A) described in FIG. 6 will be described. In the step S1, it is not necessary to use the camera 33. In a specific example, a sensor wafer may be used. The sensor wafer includes a substrate body having a shape similar to that of the wafer W in plan view, and a camera disposed at the substrate body to be directed upward. For example, the image data obtained by the camera is transmitted to the controller 10 through wires or wirelessly.

The transfer mechanism 22 transfers the sensor wafer from the transfer container C to the load-lock module 3A and places the sensor wafer on the stage 31 of the load-lock module 3A. The transfer mechanism 22 for performing such a transfer operation has been subjected to teaching, and a predetermined point (hereinafter, referred to as "O4") in the image data acquired by the sensor wafer placed on the stage 31 is located directly above the placement center point O3 of the stage 31.

Figure 6:
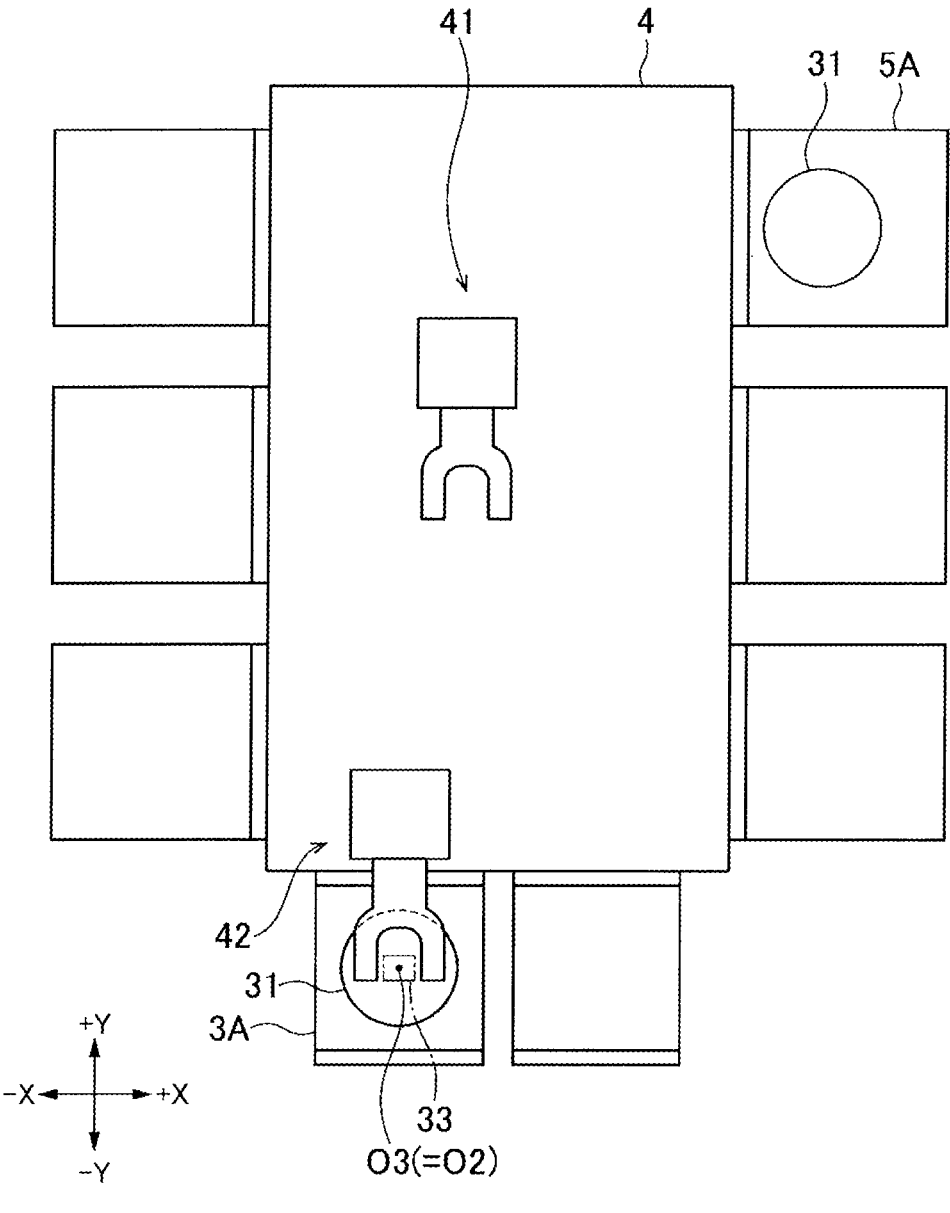
FIG. 6 explains acquisition of position data of a load-lock module 3A of a transfer body 42 that is a second transfer body with respect to a first reference position for a transfer body in step S1.
Figure 7:
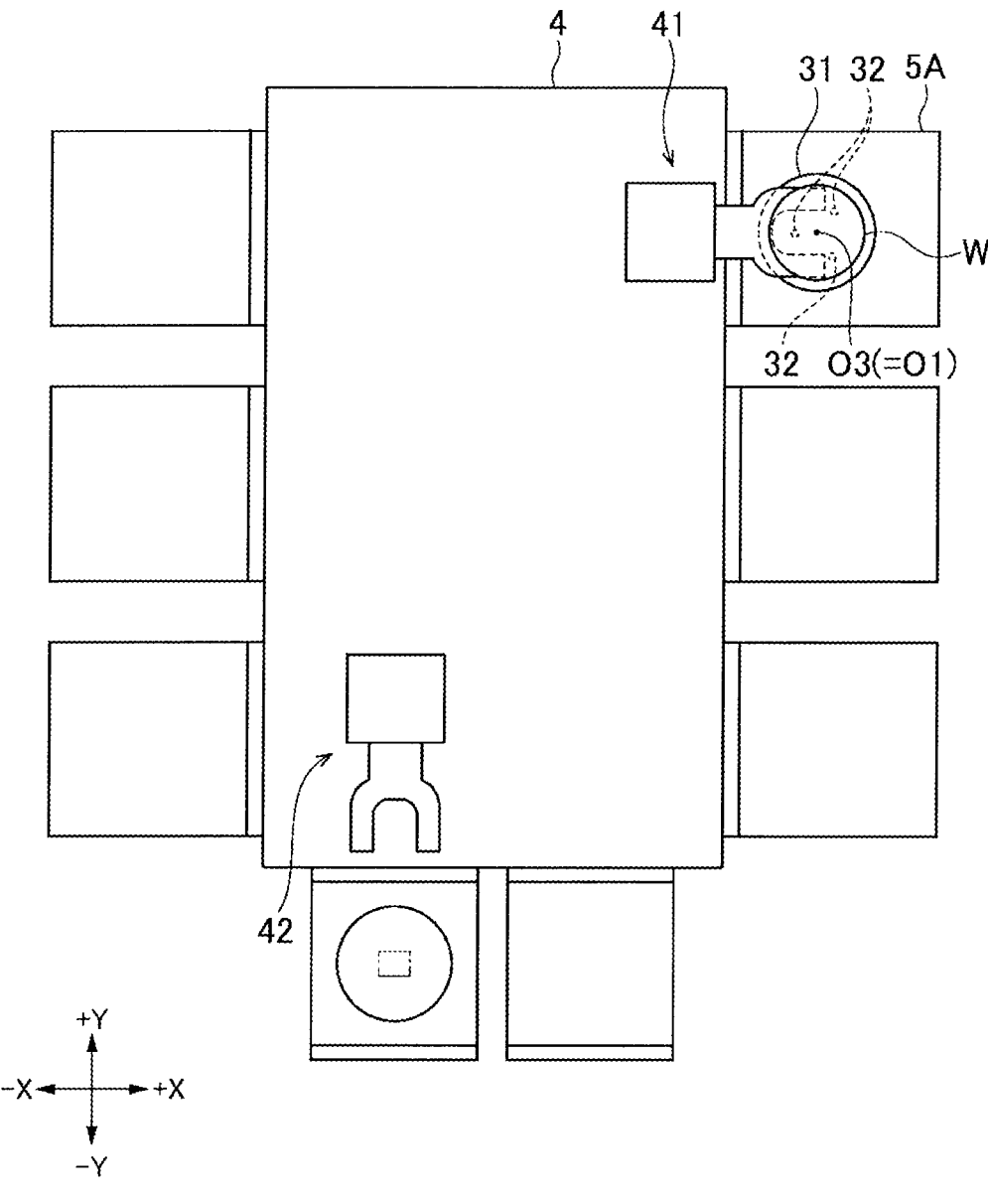
FIG. 7 explains transfer of a wafer W to a first substrate reference position for a substrate of the process module 5 by a transfer body 41 that is a first transfer body in step S2.

After the sensor wafer is transferred to the load-lock module 3A, the transfer body 42 is moved to the transfer position using the temporary position data as described in FIG. 6. Then, the support 47 of the transfer body 42 is imaged using the sensor wafer to obtain the image data. The controller 10 detects the misalignment between the support center point O2 specified from the position of the support 47 in the image data and the above-described point O4, and updates the position data to eliminate the misalignment, thereby completing the step S1.

The sensor wafer is transferred to the process module 5, and the teaching is performed similarly to the case of performing teaching for the load-lock module 3A. In that case, the sensor wafer is affected by the magnetic field while passing through the vacuum transfer module 4, so that the normal operation may not be performed. Further, in the substrate processing apparatus 1, as described above, the teaching is performed during the operation of the process module 5, for example. However, the sensor wafer is transferred into the process module 5 during the operation thereof, and thus may be exposed to a gas in the process module. In that case, the constituent members of the sensor wafer may be corroded. Therefore, it is effective to perform teaching for the process module 5 by the above-described method.

Another example of the step S1 will be described. An operator who opens the door valve G1 and enters the load module 2 maintained in an atmospheric atmosphere looks into the load-lock module 3A through the opening of the door valve G1. In that state, the position of the support 47 of the transfer body 42 in the load-lock module 3A may be checked to perform the teaching. When the transfer body 42 enters the load-lock module 3A communicating with the vacuum transfer module 4, the inner atmosphere of the vacuum transfer module 4 and the inner atmosphere of the load-lock module 3A are set to the atmospheric atmosphere so that the operator can look into the load-lock module 3A with naked eyes as described above.

In still another example, a plurality of distance sensors may be disposed on the sidewall of the housing 30 of the load-lock module 3A, and the teaching in the step S1 may be performed. The distance sensors include, e.g., a sensor for detecting the distance in the X direction and a sensor for detecting the distance in the Y direction of the support 47 of the transfer body 42 that has moved to the transfer position based on the temporary position data. Based on the detection results of the distance sensors, the controller 10 calculates the position of the support center point O2 and calculates the misalignment amounts of the support center point O2 and the placement center point O3 in the X and Y directions in plan view, thereby performing teaching.

In the case of executing the step S1 using the distance sensors instead of the camera 33, the step S4 can also be executed using the distance sensors instead of the camera 33. Specifically, in step S4, for example, the distance of the wafer W is detected using the distance sensors. The controller 10 may calculate the position of the center point O1 of the wafer W based on the detection result, and calculate the misalignment amount of the wafer W with respect to the center point O1 and the misalignment amount of the transfer position, thereby performing teaching. By performing the steps S1 and S4 using the same detector (the camera 33 or the distance sensors) disposed in the same module, it is not necessary to prepare individual detectors for performing the steps S1 and S4, which is preferable.

The detection device that is provided with the camera 33 or the distance sensors to execute the steps S1 and S4 may be disposed at a location accessible by the transfer bodies 41 and 42. Therefore, the load-lock module 3B may be used as the detection device. When the substrate processing apparatus has a configuration in which the alignment module 20 or the connection module is connected to the vacuum transfer module 4, those modules may be used as the detection device. In the apparatus configuration including a plurality of vacuum transfer modules 4, the connection module connects the vacuum transfer modules 4 and include a housing maintained in a vacuum atmosphere and a stage disposed in the housing. Unlike the above-described vacuum transfer module 4, no magnetic field is generated on the inner floor of the housing. A fixed pin is disposed on the stage of the connection module to relay the transfer of the wafer W delivered by the vertical movement of the transfer bodies 41 and 42 between two vacuum transfer modules 4.

Since the vacuum transfer module 4 is provided with the camera 33 or the distance sensors, a part of the vacuum transfer module 4 may be used as the detection device. In that case, a specific point in the area may be considered as the placement center point O3 of the load-lock module 3A. In other words, in the step S1, the teaching may be performed such that the support center point O2 of the transfer body 42 coincides with the specific point, and in the step S4, the transfer body 42 may be moved such that the support center point O2 coincides with the specific point to detect the displacement amount of the wafer W. However, when the vacuum transfer module 4 is used as the detection device, it is preferable to shield the camera 33 or the like from the magnetic field in order to prevent malfunction of the camera 33 or the like due to the influence of the magnetic field. Hence, it is preferable to use the camera 33 or the like disposed in the module where the magnetic field is not generated on the floor as a detection device in order to simplify the apparatus configuration.

Figure 8:
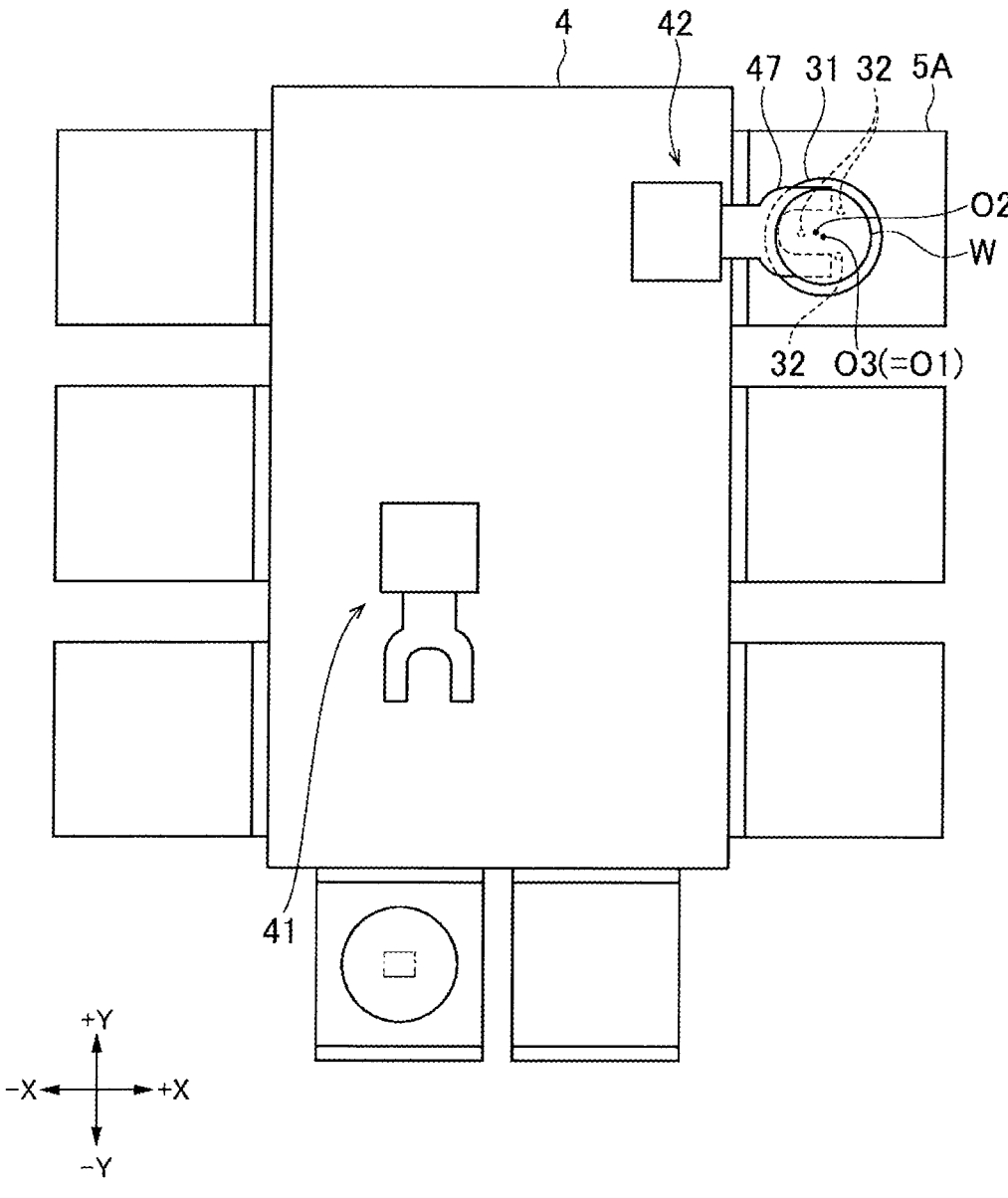
FIG. 8 explains unloading of the wafer W from the process module 5 by the transfer body 42 in step S3.
Figure 9:
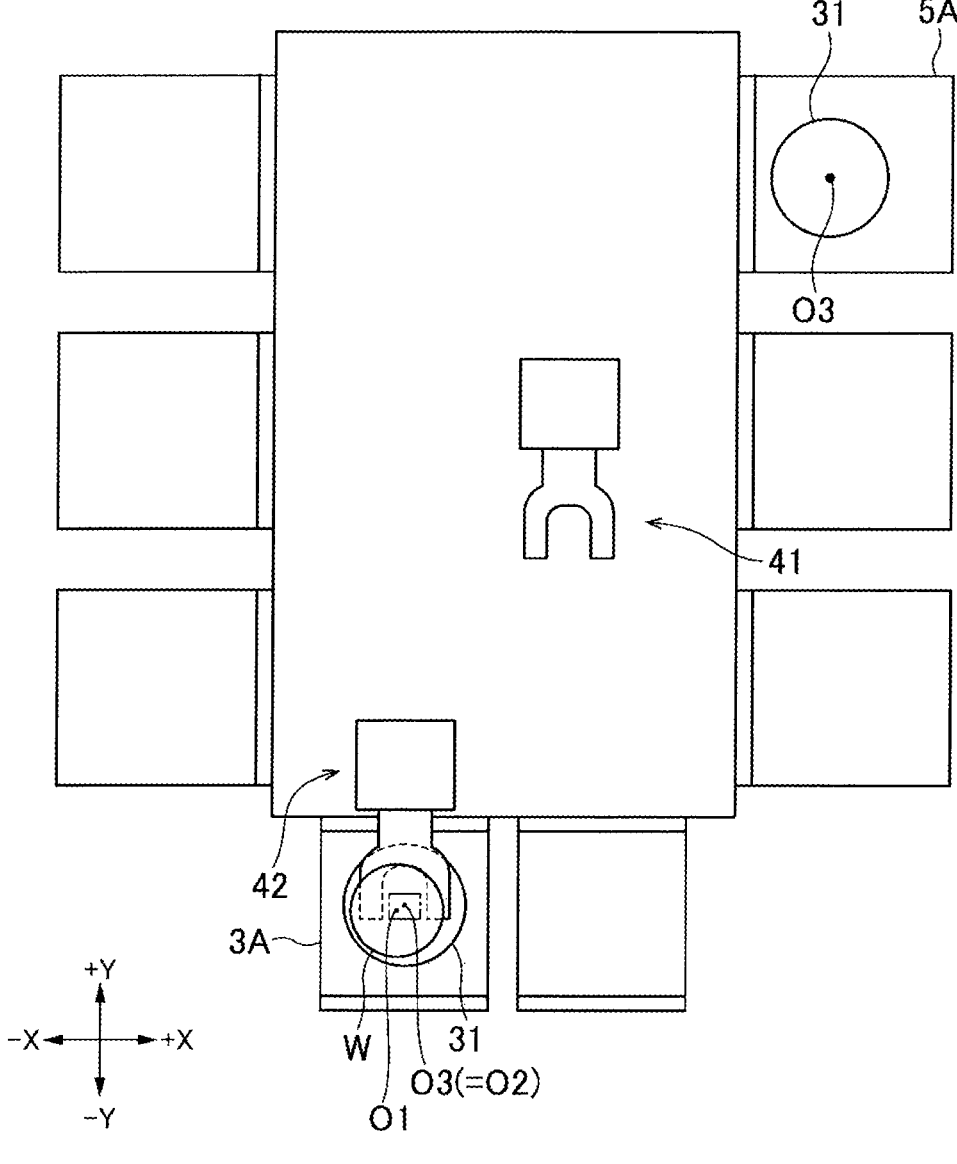
FIG. 9 explains movement of the transfer body 42 to the first reference position for a transfer body, detection of the misalignment amount between the wafer W and a second reference position for a substrate, and teaching in step S4.

In the step S3 described in FIG. 8, the transfer body 42 that has not yet been subjected to teaching enters the module based on the temporary position data and receives the wafer W. For example, a camera 52 is provided as a detector near each module to be subjected to teaching in the vacuum transfer module 4 to obtain image data, and the position of the transfer body 42 that enters the corresponding module is adjusted based on the image data. In other words, the path of the transfer body 42 with respect to the module is changed by the image data. By adjusting the position, the device configuration in which the interference with the gate valves G2 and G3 forming the inlets of the modules is more reliably avoided may be obtained. The interference may also be avoided by providing a distance sensor as a detector instead of the camera 52 and detecting the position of the transfer body 42 before it enters the module. In addition, a photoelectric sensor such as a fiber sensor or an area sensor may be used as the detector.

Figure 12:
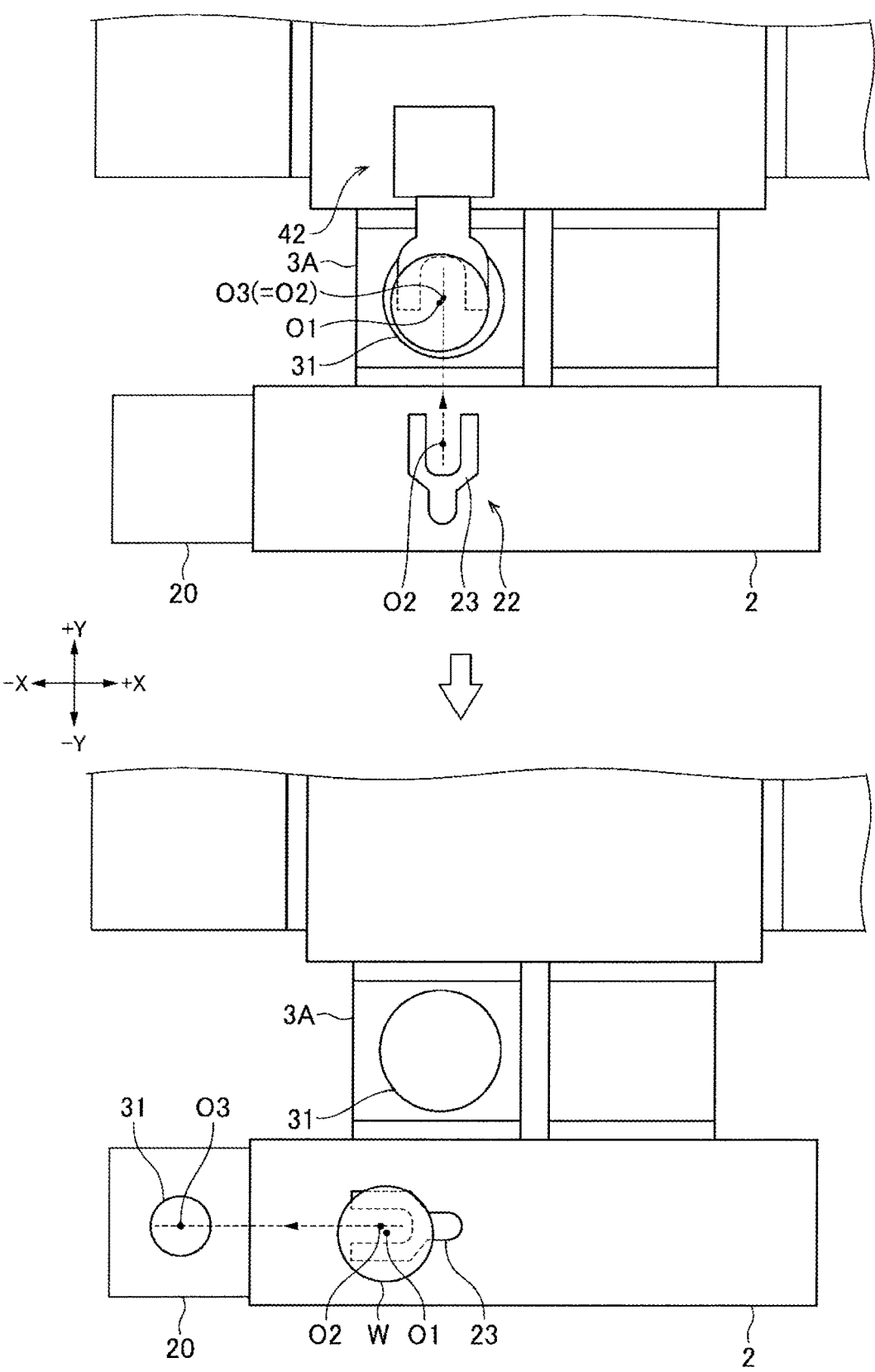
FIG. 12 is a plan view illustrating a modification of the teaching.

Next, a modification of the step S4 described in FIG. 10 will be described with reference to FIG. 12. In FIG. 12, the support center point of the end effector 23 of the transfer mechanism 22 is indicated by O2, similarly to the support center points of the transfer bodies 42 and 43. Then, the step S4 is started so that the wafer W is transferred by the transfer body 42 from the process module 5A to the load-lock module 3A and placed on the stage 31. At this time, the placement center point O3 of the stage 31 is misaligned with the center point O1 of the wafer W (see upper side of FIG. 12). The wafer W is received by the transfer mechanism 22 of the loader module 2. Since the teaching of the transfer mechanism 22 has been completed, the support center point O2 of the transfer mechanism 22 is positioned on the placement center point O3 when the wafer W is received. Therefore, in plan view, the center point O1 of the wafer W and the support center point O2 of the transfer mechanism 22 are misaligned by the amount corresponding to the misalignment amount between the placement center point O3 of the load-lock module 3A and the center point O1 of the wafer W.

Then, the wafer W is transferred such that the support center point O2 of the transfer mechanism 22 coincides with the placement center point O3 of the stage 31 of the alignment module 20 (see lower side of FIG. 12), and is placed on the stage 31. Since the wafer W is transferred in this manner, the misalignment of the center point O1 of the wafer W with respect to the placement center point O3 in plan view corresponds to the misalignment of the transfer position described in FIG. 10 (the misalignment amount between the support center of the transfer body 42 and the misalignment amount between the support center point O2 and the placement center point O3 of the process module 5A).

The configuration of the alignment module 20 will be described. During a single revolution of the stage 31 having a diameter smaller than the diameter of the wafer W about the vertical axis together with the wafer W, light is irradiated from a light transmitting portion disposed above or below the peripheral edge of the wafer W to a light receiving portion disposed above or below the peripheral edge of the wafer W.

The light receiving portion receives the light that has passed the side portion of the wafer W. In this state, the controller 10 detects the position of the center point O1 of the wafer W, and further calculates the misalignment amount between the center point O1 and the placement center point O3 of the alignment module 20. Therefore, it is possible to calculate the misalignment amount of the transfer position and perform teaching.

Therefore, in the example of FIG. 12, the alignment module 20 serves as the detection device, and the position of the detection device is different from the first reference position (position in the load-lock module 3A) for a transfer body that is predetermined so that the transfer body 42 receives and transfers the wafer W. When the wafer W is transferred to another member (the transfer mechanism 22 in the example of FIG. 12) in a state where the misalignment between the wafer W and the transfer body 42 that has moved to the first reference position for a transfer body is maintained, the teaching can be performed by detecting the position of the wafer W using the transfer destination by another member as a detection device. Since, however, the position of the wafer W may be misaligned when the wafer W is transferred between the transfer body 42 and another member, it is preferable to perform teaching by setting the position in the detection device as the first reference position for a transfer body and detecting the position of the wafer W at the first reference position.

FIG. 10 and the like illustrate that the misalignment amount of the wafer W and the misalignment amount of the transfer position are calculated based on the image data, for example, and the teaching is performed using the misalignment amount of the transfer position in the step S4 of the substrate processing apparatus 1. However, the apparatus configuration in which the teaching is not performed may be adopted. For example, the controller 10 includes a display device that displays the misalignment amount of the wafer W and/or the misalignment amount of the transfer position. Then, the steps S1 to S4 are executed for maintenance of the substrate processing apparatus 1. However, in the step S4, the teaching (i.e., updating of the position data in the memory 11) is not performed, and the misalignment amount of the wafer W and/or the misalignment amount of the transfer position is displayed on the display device. When an operator determines that the misalignment alignment is large from the display thereof, the operator may release the formation of a vacuum atmosphere in the vacuum transfer module 4 and the process module 5 and perform inspection. Even in the configuration in which the teaching is not performed, the misalignment amount of the wafer W and the misalignment amount of the transfer position can be easily acquired, so that the burden on the operator at the time of checking the state of the apparatus can be reduced, which is preferable.

Although the case in which the transfer bodies 41 and 42 deliver the wafer W with respect to each module (receiving the wafer W from the module and transmitting the wafer W to the module) has been described, it is also possible to transfer the wafer W to one module using one of the transfer bodies 41 and 42 and receive the wafer W from the module using the other transfer body. In the vacuum transfer module 4, the wafer W may be transferred by any transfer body 41 or 42. Therefore, the positions of the transfer bodies 41 and 42 determined in the step S4 may be used only for receiving the wafer W from the module or only for transferring the wafer W to the module. Even if the positions are used only for receiving the wafer W or only transferring the wafer W, the positions can be used for both receiving the wafer W from the module and transmitting the wafer W to the module. Thus, in the step S4, both the receiving position and the transferring position are determined.

In the vacuum transfer module 4, it is not necessary to provide only two transfer bodies 41 and 42, and a larger number of transfer bodies may be provided. When there are three or more transfer bodies, an operator performs manual teaching of one transfer body and, then, the other transfer bodies may be subjected to automatic teaching. Specifically, the teaching for the module may be performed by executing the steps S1, S3, and S4 for other transfer bodies (i.e., a plurality of second transfer bodies). In the step S2 executed by the first transfer body (transfer of the wafer W to the first reference position for a substrate), a transfer body of which teaching with respect to the module has been completed at the time of executing the step S2 may be used. In other words, the transfer body that has been subjected to manual teaching may be used. Alternatively, if there is a transfer body that has been subjected to automatic teaching among the other transfer bodies, it may be used. In other words, in this example, the transfer body that is the second transfer body may complete the function of the first transfer body.

The module as a teaching target is not limited to the process module 5 and the load-lock modules 3A and 3B, and may be the above-described connection module, for example. Further, although the transfer bodies 41 and 42 move in the housing 40 maintained in a vacuum atmosphere in the substrate processing apparatus 1, the apparatus configuration in which the transfer bodies 41 and 42 move in the housing 40 maintained in an atmospheric atmosphere may be adopted. When the housing 40 is maintained in an atmospheric atmosphere, the process module 5 connected to the housing 40 and to which the wafer W is transferred by the transfer bodies 41 and 42 may also be maintained in an atmospheric atmosphere, for example. In addition, the substrate as a transfer target in the present disclosure is not limited to a circular substrate, and may be a rectangular substrate.

The embodiments of the present disclosure are illustrative in all respects and are not restrictive. The above-described embodiments may be omitted, replaced, chanced and/or combined in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate transfer method for transferring a substrate using a first transfer body and at least one second transfer body, each floating from a bottom portion of a substrate transfer area by a magnetic force and moving in a horizontal direction while supporting the substrate, comprising:

transferring the substrate using the first transfer body to a predetermined first substrate reference position in a module;

receiving the substrate at the first substrate reference position using the second transfer body; and transferring the substrate to a detection device by moving the second transfer body to a predetermined first transfer body reference position and detecting positional misalignment in plan view between a position of the substrate and a predetermined second substrate reference position in the detection device.

2. The substrate transfer method of claim 1, further comprising:

correcting a position at which the second transfer body transfers the substrate to the module based on the positional misalignment.

3. The substrate transfer method of claim 2, wherein the second transfer body includes a plurality of second transfer bodies, and said receiving, said transferring and detecting, and said correcting are performed for each of the second transfer bodies.

4. The substrate transfer method of claim 1, wherein the first transfer body reference position is a position in the detection device.

5. The substrate transfer method of claim 1, further comprising:

before said receiving, obtaining first data for positioning the second transfer body at the first transfer body reference position.

6. The substrate transfer method of claim 5, wherein in said obtaining the first data, a position of the second transfer body is detected by the detection device, and the first data is obtained based on the detection result of the position of the second transfer body.

7. The substrate transfer method of claim 1, wherein said receiving includes:

detecting a position of the second transfer body using a detector; and changing a path of the second transfer body with respect to the module based on the detection result of the position of the second transfer body.

8. The substrate transfer method of claim 1, wherein the substrate transfer area is an area in a vacuum transfer module in which a vacuum atmosphere is formed, the module is a process module connected to the vacuum transfer module and in which a vacuum atmosphere is formed to process the substrate, and said transferring, said receiving, and said transferring and detecting are performed in a state where the vacuum transfer module and the process module are maintained in a vacuum atmosphere.

9. The substrate transfer method of claim 8, wherein the atmosphere in the substrate transfer area is switched from an atmospheric atmosphere to a vacuum atmosphere in a state where the atmosphere in the process module is maintained in a vacuum atmosphere and, then, said transferring, said receiving, said transferring and detecting, and obtaining first data for positioning the second transfer body at the first transfer body reference position, which is executed before said receiving, are performed in a state where the process module and the substrate transfer area are maintained in a vacuum atmosphere.

10. The substrate transfer method of claim 8, further comprising:

before said transferring, obtaining second data for positioning the first transfer body at a second transfer body reference position for transferring the substrate to the first substrate reference position in a state where the substrate transfer area and the process module are maintained in an atmospheric atmosphere.

11. The substrate transfer method of claim 9, further comprising:

before said transferring, obtaining second data for positioning the first transfer body at a second transfer body reference position for transferring the substrate to the first substrate reference position in a state where the substrate transfer area and the process module are maintained in an atmospheric atmosphere.

12. A substrate transfer apparatus comprising:

a first transfer body and a second transfer body, each floating from a bottom portion of a substrate transfer area by a magnetic force and moving in a horizontal direction while supporting a substrate;

a module for transferring the substrate by the first transfer body and the second transfer body; and a controller configured to output a control signal to execute transferring the substrate to a predetermined first substrate reference position in the module using the first transfer body;

receiving the substrate at the first substrate reference position using the second transfer body; and transferring the substrate to a detection device by moving the second transfer body to a predetermined first transfer body reference position and detecting positional misalignment in plan view between a position of the substrate and a predetermined second substrate reference position in the detection device.

* * * * *